United States Patent
Zywiak et al.

(10) Patent No.: US 7,334,422 B2
(45) Date of Patent: Feb. 26, 2008

(54) CABIN AIR CONDITIONING SYSTEM WITH LIQUID COOLING FOR POWER ELECTRONICS

(75) Inventors: Thomas Zywiak, Suffield, CT (US); Louis J. Bruno, Ellington, CT (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 263 days.

(21) Appl. No.: 11/289,036

(22) Filed: Nov. 29, 2005

(65) Prior Publication Data

US 2007/0119205 A1    May 31, 2007

(51) Int. Cl.
*F25D 9/00* (2006.01)
(52) U.S. Cl. .......................................... 62/401; 62/402
(58) Field of Classification Search .............. 62/86–88, 62/401–403, 172, 241, DIG. 5, 2; 60/39.07
See application file for complete search history.

(56) References Cited

U.S. PATENT DOCUMENTS

| | | | | |
|---|---|---|---|---|
| 3,878,692 A | * | 4/1975 | Steves | 62/87 |
| 4,209,993 A | * | 7/1980 | Rannenberg | 62/80 |
| 4,352,273 A | * | 10/1982 | Kinsell et al. | 62/87 |
| 4,374,469 A | * | 2/1983 | Rannenberg | 62/402 |
| 4,963,174 A | * | 10/1990 | Payne | 62/87 |
| 5,086,622 A | * | 2/1992 | Warner | 62/88 |
| 5,323,624 A | * | 6/1994 | Schwalm | 62/401 |
| 5,461,882 A | * | 10/1995 | Zywiak | 62/401 |
| 5,887,445 A | * | 3/1999 | Murry et al. | 62/402 |
| 6,148,622 A | * | 11/2000 | Sanger | 62/88 |
| 6,257,003 B1 | * | 7/2001 | Hipsky | 62/88 |
| 6,381,969 B1 | * | 5/2002 | Afeiche et al. | 62/87 |
| 6,519,969 B2 | * | 2/2003 | Sauterleute | 62/401 |

FOREIGN PATENT DOCUMENTS

GB    166542 A  *  5/1986

* cited by examiner

Primary Examiner—Mohammad M. Ali
(74) Attorney, Agent, or Firm—Carlson, Gaskey & Olds

(57) ABSTRACT

An air conditioning system is provided with a cooling air ram that includes both air-to-air heat exchangers, and a liquid sink heat exchanger. The liquid sink heat exchanger receives a cooling fluid that has been utilized to cool a power electronics control for an electric motor. The liquid sink heat exchanger is necessary to properly cool the power electronics control, and by including it in the same cooling air ram with the air-to-air heat exchangers, there is no need for additional ram air cooling circuits to be added to the gas turbine engine.

8 Claims, 1 Drawing Sheet

200
CABIN AIR CONDITIONING SYSTEM WITH LIQUID COOLING FOR POWER ELECTRONICS

BACKGROUND OF THE INVENTION

This application relates to a cooling air ram that cools both working air for an air conditioning system, and also cools a liquid heat sink for cooling power electronics associated with an electric motor.

Aircraft air conditioning systems include a number of components. In a typical air conditioning system, a fan moves air to provide the heat sink for ground operation. The air passes through heat exchangers that are placed in a path of cooling air flow drawn by the fan. Thus, the fan draws air over a plurality of heat exchangers to cool the air being delivered to the several components.

More recently, high-powered electric motors are being used to drive various devices such as compressors and pumps for aircraft air conditioning systems. Power electronics controllers guide high current/voltage electrical power to an electric motor. These power electronics controls become quite hot during operation, and thus cooling is necessary. In general, to provide a separate cooling circuit for the power electronics would be undesirable.

SUMMARY OF THE INVENTION

In a disclosed embodiment of this invention, a heat exchanger for cooling fluid delivered to power electronics is cooled in the same ram as the air mentioned above. By utilizing a single cooling air ram, the present invention results in a simplified design, in which additional cooling air circuitry is not necessary.

In one disclosed embodiment of this invention, a cooling air ram is provided for cooling a plurality of air heat exchangers, and a liquid heat exchanger for cooling the power electronics.

In another embodiment, the cooling air ram is provided with a plurality of liquid cooling heat exchangers, and a plurality of air heat exchangers.

These and other features of the present invention can be best understood from the following specification and drawings, the following of which is a brief description.

DETAILED DESCRIPTION OF THE PREFERRED EMBODIMENT

Figure 1:
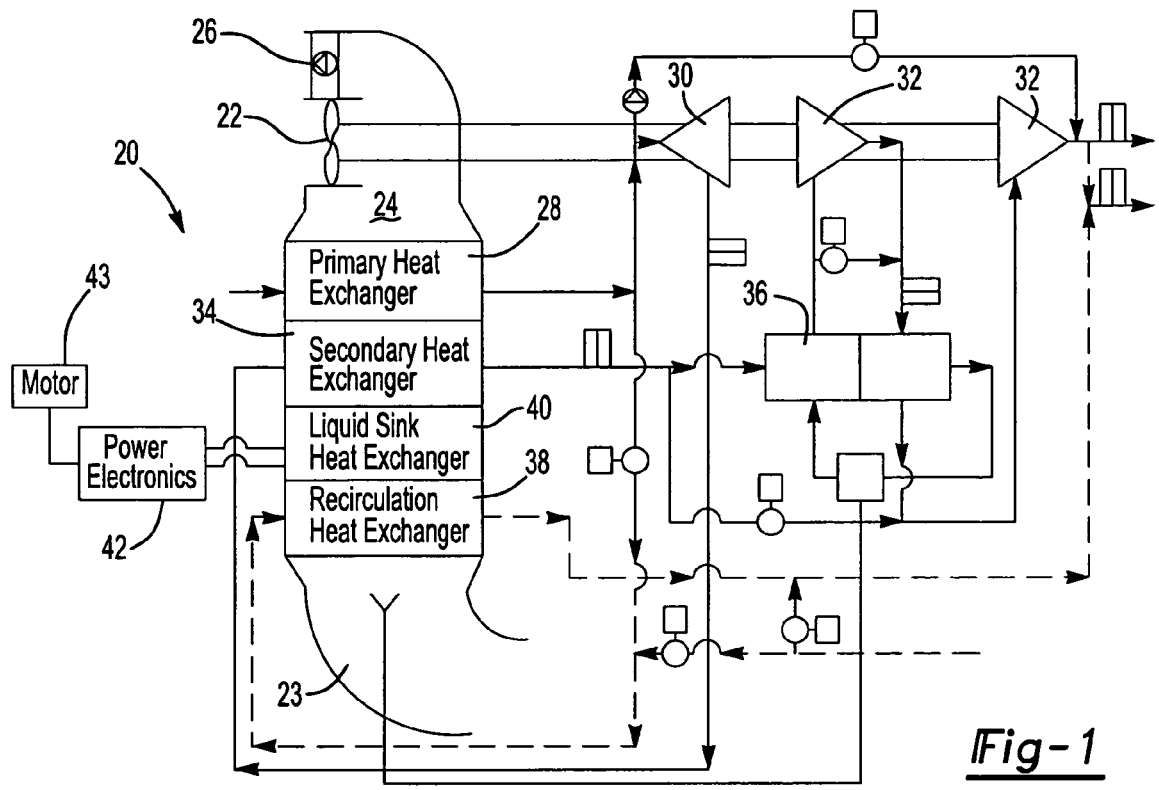
FIG. 1 is a schematic view of a first embodiment.

An aircraft air conditioning system is shown schematically in FIG. 1 at 20. A fan 22 is associated with a compressor 30 and turbine sections 32. A cooling air ram is provided by fan 22 drawing air from an inlet 23 to a ram outlet 24 approaching the fan impeller. A check valve 26 allows the flow of additional air through the heat exchangers as necessary.

Air driven by the fan cools a primary heat exchanger 28. Primary heat exchanger 28 cools a flow of air being delivered to the compressor 30, and downstream as shown in the FIG. 1 schematic. A secondary heat exchanger 34 also cools air, with the air passing through the secondary heat exchanger flowing from the compressor 30, and into a reheater/condenser 36.

A recirculation air heat exchanger 38 also receives a flow of air, and passes the air to the cabin of an aircraft.

The present invention incorporates a liquid sink heat exchanger 40 into the ram and the array of heat exchangers between the inlet 23 and the ram outlet 24. The liquid sink heat exchanger receives a cooling fluid, which is delivered to cool power electronics 42 for controlling an electric motor 43. The function and structure of power electronics 42, and the need for incorporating such for controlling a motor 43 is as known. Further, the concept of having to provide liquid cooling for such power electronics is generally known.

The present invention is the incorporation of a heat exchanger 40 for the cooling fluid into the cooling air ram. By utilizing this inventive array of heat exchangers, the present invention eliminates any need for a separate ram circuit.

Figure 2:
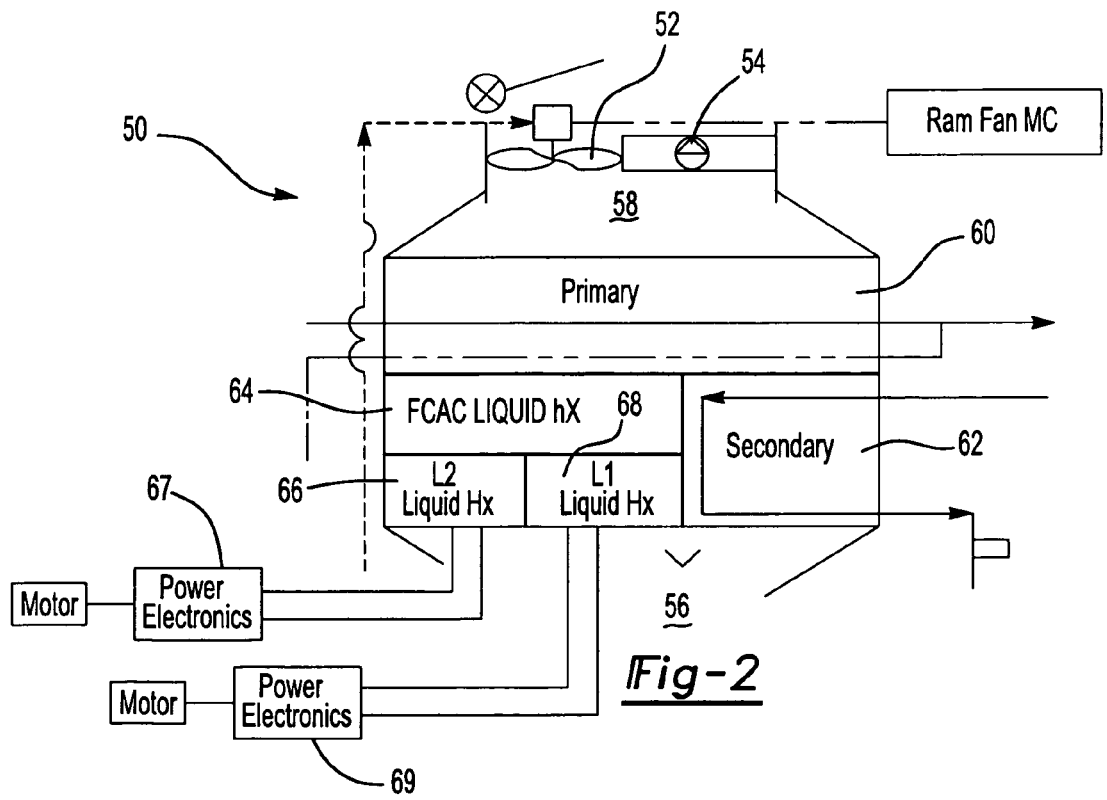
FIG. 2 is a schematic view of a second embodiment.

FIG. 2 shows another embodiment 50 wherein the fan 52 is associated with its check valve 54. The inlet 56 delivers air over a plurality of heat exchangers into a ram outlet 58 approaching the impeller for the fan 52. There is a primary heat exchanger 60 for the cooling air being delivered to the compressor 30 and the secondary heat exchanger 62 as in FIG. 1. A liquid heat exchanger 64 for cooling a refrigerant associated with the power electronics controllers is also placed within the ram circuit. Heat exchangers 66 and 68 are associated with power electronics 67 and 69, respectively. Again, the present invention thus provides a cooling air ram that cools both air for various uses for an air conditioning system for an associated aircraft, and also provides a heat sink for cooling a cooling liquid, which is, in turn, utilized to cool control power electronics.

Although a preferred embodiment of this invention has been disclosed, a worker of ordinary skill in this art would recognize that certain modifications would come within the scope of this invention. For that reason, the following claims should be studied to determine the true scope and content of this invention.

What is claimed is:

1. An aircraft air conditioning system comprising:
   a fan, a compressor, and at least one turbine section; and
   a cooling air ram to be connected to said fan, said cooling air ram having an inlet, and an outlet leading to the fan, air flowing from said inlet to said outlet passing over a plurality of heat exchangers, with said plurality of heat exchangers including at least a first air-to-air heat exchanger for cooling air being delivered to said compressor, and a liquid heat exchanger for cooling a cooling liquid, said cooling liquid being delivered to a power electronics control for an electric motor, and such that said air passing to the fan cools both said air-to-air heat exchanger and said liquid heat exchanger.

2. The aircraft air conditioning system as set forth in claim 1, wherein there are a plurality of air-to-air heat exchangers in said cooling air ram.

3. The aircraft air conditioning system as set forth in claim 2, wherein there are a plurality of liquid heat exchangers cooling a cooling fluid being delivered to a plurality of power electronics controls for electric motors.

4. The aircraft air conditioning system as set forth in claim 1, wherein there are a plurality of liquid heat exchangers cooling a cooling fluid being delivered to a plurality of power electronics controls for electric motors.

5. A cooling ram air circuit for an aircraft air conditioning system comprising:

a cooling air ram to be connected to a fan, said cooling air ram having an inlet, and an outlet to lead to the fan, air flowing from said inlet to said outlet passing over a plurality of heat exchangers, with said plurality of heat exchangers including at least a first air-to-air heat exchanger for cooling air being delivered to a compressor, and a liquid heat exchanger for cooling a cooling liquid, said cooling liquid being delivered to a power electronics control for an electric motor, and such that said air passing to the fan cools both said air-to-air heat exchanger and said liquid heat exchanger.

6. The cooling ram air circuit as set forth in claim 5, wherein there are a plurality of air-to-air heat exchangers in said cooling air ram.

7. The cooling ram air circuit as set forth in claim 6, wherein there are a plurality of liquid heat exchangers cooling a cooling fluid being delivered to a plurality of power electronics controls for electric motors.

8. The cooling ram air circuit as set forth in claim 5, wherein there are a plurality of liquid heat exchangers cooling a cooling fluid being delivered to a plurality of power electronics controls for electric motors.

* * * * *